United States Patent
Sinthomez et al.

(10) Patent No.: US 10,366,846 B2
(45) Date of Patent: Jul. 30, 2019

(54) REMOTE CONTROL DEVICE FOR AN ELECTRICAL DEVICE IN AN ELECTRICAL ENCLOSURE

(71) Applicant: SCHNEIDER ELECTRIC INDUSTRIES SAS, Rueil Malmaison (FR)

(72) Inventors: Daniel Sinthomez, Domene (FR); Florent Pitis, Brie et Angonnes (FR)

(73) Assignee: SCHNEIDER ELECTRIC INDUSTRIES SAS, Rueil Malmaison (FR)

( * ) Notice: Subject to any disclaimer, the term of this patent is extended or adjusted under 35 U.S.C. 154(b) by 0 days.

(21) Appl. No.: 15/400,385

(22) Filed: Jan. 6, 2017

(65) Prior Publication Data
US 2017/0243701 A1 Aug. 24, 2017

(30) Foreign Application Priority Data
Feb. 19, 2016 (FR) ...................... 16 51364

(51) Int. Cl.
*H01H 3/10* (2006.01)
*H01H 3/40* (2006.01)
(Continued)

(52) U.S. Cl.
CPC ............. *H01H 3/10* (2013.01); *H01H 3/40* (2013.01); *H01H 9/16* (2013.01); *H01H 9/22* (2013.01);
(Continued)

(58) Field of Classification Search
CPC ............ H01H 3/10; H01H 9/16; H01H 71/56; H01H 9/223; H01H 3/40; H01H 9/22;
(Continued)

(56) References Cited

U.S. PATENT DOCUMENTS 5,609,244 A 3/1997 Reiter
2010/0300860 A1 12/2010 Lu
(Continued)

FOREIGN PATENT DOCUMENTS

DE 10 2013 112 570 A1 5/2015

OTHER PUBLICATIONS

French Search Report dated Sep. 20, 2016 in French Application 16 51364, filed on Feb. 19, 2016 (with Translation of Categories of cited documents and Written Opinion).

*Primary Examiner* — Edwin A. Leon
*Assistant Examiner* — Lheiren Mae A Caroc
(74) *Attorney, Agent, or Firm* — Oblon, McClelland, Maier & Neustadt, L.L.P.

(57) ABSTRACT

A remote control device includes a rotary control member that can be selectively moved between first and second configurations, a transmission system suitable for mechanically linking the rotary member to a control lever of an electrical device. The movement of the rotary control member drives the control lever to move respectively between first and second positions. The rotary control member is to be mounted on a side walls of a housing, the transmission system includes a first pinion, secured in rotation with the rotary control member about a first axis, a second pinion, meshed with the first pinion and rotationally mobile about a second fixed axis at right angles to the first fixed axis and intended to be coupled mechanically with the control lever to move this lever when the second pinion is moved in rotation.

14 Claims, 8 Drawing Sheets

(51) Int. Cl.
*H01H 9/16* (2006.01)
*H01H 9/22* (2006.01)
*H05K 5/00* (2006.01)
*H05K 5/02* (2006.01)
*H01H 71/56* (2006.01)

(52) U.S. Cl.
CPC ............ *H01H 9/223* (2013.01); *H01H 71/56* (2013.01); *H05K 5/0013* (2013.01); *H05K 5/0221* (2013.01); *H05K 5/0239* (2013.01); *H01H 2003/105* (2013.01); *H01H 2071/565* (2013.01); *H01H 2231/032* (2013.01); *H01H 2239/044* (2013.01)

(58) Field of Classification Search
CPC ....... H01H 2239/044; H01H 2003/105; H01H 2231/032; H01H 2071/565; H05K 5/0221; H05K 5/0013; H05K 5/0239
USPC ............ 200/501, 50.01–50.04, 50.12, 50.05, 200/50.06
See application file for complete search history.

(56) References Cited

U.S. PATENT DOCUMENTS

| | | | |
|---|---|---|---|
| 2013/0015940 A1* | 1/2013 | Dunker | ................ H01H 9/104 337/12 |
| 2015/0364277 A1 | 12/2015 | Fischer et al. | |
| 2016/0099117 A1* | 4/2016 | Dunker | ................ H01H 9/223 337/12 |

* cited by examiner

REMOTE CONTROL DEVICE FOR AN ELECTRICAL DEVICE IN AN ELECTRICAL ENCLOSURE

The invention relates to a remote control device for an electrical device arranged in an electrical enclosure. The invention also relates to an electrical enclosure comprising a controllable electrical device and such a remote control device for controlling the electrical device from outside the enclosure.

As is known, in industrial or home automation electrical installations, electrical devices such as circuit breakers are installed in electrical cabinets or enclosures. These enclosures are typically closed by a door provided with a lock, to prevent access to the electrical devices while they are operating, so as to prevent a user from being able to come into contact with an electrically live part of the installation. For safety reasons, a remote control device for the device is placed on the enclosure to control the device from outside the enclosure, even when the door is closed. For example, a control handle is installed on the outside of the wall and is linked mechanically to the electrical device to switch it on or switch it off again.

Often, in pre-existing installations, the electrical device is provided with a control lever which can be actuated only when the door is open. A dedicated remote control device is then installed, which is added to this electrical device and which is coupled mechanically to the control lever. A handle is then installed on the door of the enclosure, facing the device.

For reasons of bulk and for ergonomic reasons, it is sometimes desirable to place the control handle on a side face of the enclosure, even when the electrical device does not natively provide such a configuration.

It is these drawbacks that the invention intends more particularly to remedy by proposing a remote control device for a control lever of an electrical device installed in an electrical enclosure, this control device being able to be installed without preference on a right or left side flank of the electrical enclosure by being offset relative to the face of the electrical device which bears the control lever.

To this end, the invention relates to a remote control device for an electrical device in an electrical enclosure, this enclosure including a bottom wall and side walls extending essentially at right angles relative to the bottom wall and delimiting a housing, an electrical device being fixed, on the bottom wall, inside the housing, this device comprising:
  a rotary control member, suitable for being fixed onto a wall of the enclosure outside the housing, this rotary control member being able to be selectively moved between first and second configurations,
  a transmission system suitable for mechanically linking the rotary control member to a control lever of the electrical device, this control lever being able to be moved between the first and second positions, the transmission system being configured so that the movement of the rotary control member between its first and second configurations drives the control lever to move respectively between its first and second positions.

According to the invention, the rotary control member is intended to be mounted on one of the side walls of the housing and is rotationally mobile and the transmission system comprises:
  a first pinion, secured in rotation with the rotary control member about a first fixed axis, essentially at right angles to the side walls
  a second pinion, meshed with the first pinion and rotationally mobile about a second fixed axis at right angles to the first fixed axis, this second pinion being intended to be coupled mechanically with the control lever to move this control lever between its first and second positions when the second pinion is moved in rotation.

By virtue of the invention, the rotary member can be placed on any of the side walls of the enclosure. The transmission system causes the rotary control member to be enabled to turn in a same direction of rotation according to whether it is located on one side or on the other of the enclosure, to move the control lever to a same state.

Thus, the installation of the device is simplified.

In effect, for ergonomic reasons, it is desirable to observe a predefined direction of rotation to switch the device between its on and off positions. The transmission system which links the control handle to the lever of the electrical device must therefore be adapted according to whether the user wants to install the control handle on the right flank or on the left flank of the electrical enclosure. The known devices are not the same depending on whether they are designed to be installed on one side or on the other of the electrical enclosure. This results in logistical constraints, because it is necessary to manufacture two different versions of the control system for the electrical device. The installation of an electrical enclosure comprising a device provided with such a known control device is thus more complicated, because the installer has to have appropriate parts available depending on the side on which he or she will of chosen to install the control handle.

By contrast, by virtue of the invention, the control device works with a same rotary control member which can be installed on any side wall of the electrical enclosure.

According to advantageous but not obligatory aspects of the invention, such a control device can incorporate one or more of the following features, taken in any technically acceptable combination:
  the rotary control member comprises a rotary handle mounted on the side wall and a shaft extending essentially along a third axis and which secures, in rotation about the first axis, a mobile portion of the rotary handle with the first pinion;
  the rotary control member comprises a connecting end-fitting with the first pinion, this connecting end-fitting being secured with no degree of freedom with an end of the shaft and having a head received in a housing of complementary form formed on the first pinion to secure the shaft in rotation with the first pinion;
  the head of the connecting end-fitting comprises a snug protruding from this head in a direction essentially at right angles to the third axis, whereas the first pinion comprises a cavity of complementary form to receive this snug when the end-fitting is received in the housing;
  the head of the connecting end-fitting comprises a ball joint, the first pinion comprising a housing of complementary form to receive this ball joint;
  the third axis exhibits an angular offset of angle a relative to the first axis, the angle a having a value less than or equal to 10°, preferably 5°, even more preferably 2°.
  The control lever can be moved between its first and second positions by movement in a direction essentially parallel to the plane containing the bottom of the housing. The transmission system comprises a third pinion meshed with the second pinion and rotationally mobile about a fourth fixed axis parallel to the second fixed axis, this third pinion comprising claws configured to be arranged on either side of the control lever;

the transmission system comprises a casing inside which are arranged the first and second pinions, this casing being suitable for being fixed onto the electrical device to control the movement of the control lever thereof.

According to another aspect, the invention relates to an electrical enclosure, comprising a bottom wall and side walls extending at right angles relative to the bottom wall, these walls delimiting a housing, an electrical device, fixed inside the housing on the bottom wall and comprising a control lever that can be moved between first and second positions, a remote control device for the electrical device, comprising:

a rotary control member, fixed onto a wall of the enclosure outside of the housing, this rotary control member being able to be selectively moved between first and second configurations, a transmission system which mechanically links the rotary control member to the control lever, for the movement of the rotary control member between its first and second configurations to drive the control lever to move respectively between its first and second positions, in which the remote control device is in accordance with the invention, the rotary control member being fixed onto one of the side walls and being rotationally mobile about a third fixed axis essentially at right angles to this side wall, the second pinion being coupled mechanically with the control lever.

According to advantageous but not obligatory aspects of the invention, such an electrical enclosure can incorporate one or more of the following features, taken in any technically acceptable combination:

a door that can be moved selectively between positions of opening and of closing of the housing, and a system for locking the door in its closed position, this locking system comprising a hook and a ring, one or other of the hook and of the ring being fixed onto an inner wall of the door, the other of the hook and of the ring being mounted on the transmission system and being secured in rotation about the third axis with the rotary control member, between:

a locking position, in which, when the door is in the closed position, the hook penetrates into the ring and prevents the movement of the door to its open position, and an unlocking position, in which, when the door is in the closed position, the hook and the ring are remote from one another and allow the movement of the door to its open position.

The other is mounted on and secured in rotation with the shaft.

The invention will be better understood and other advantages thereof will become more clearly apparent in light of the following description, of an embodiment of a control device given purely as a nonlimiting example and with reference to the attached drawings in which.

Figure 1:
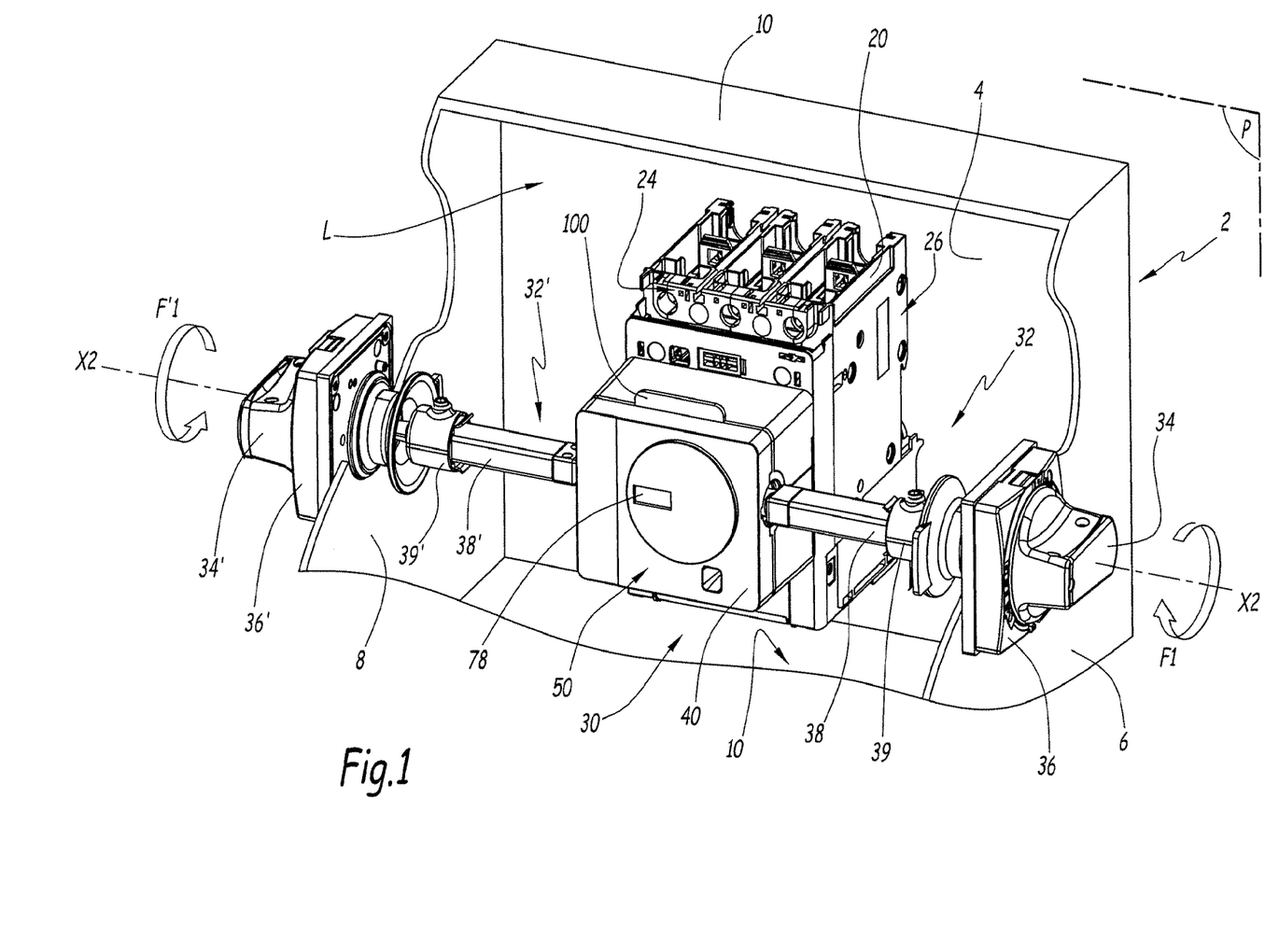
FIGS. 1 and 2 are cutaway perspective views of an electrical enclosure containing an electrical device provided with a control device according to the invention, the rotary control handles of which are illustrated, respectively, in a first configuration and a second configuration.

FIG. 1 shows an electrical enclosure 2, which comprises:
a bottom wall 4 which extends essentially along a geometrical plane P, here vertical;
right 6 and left 8 side walls which extend at right angles relative to the plane P;
top and bottom end walls 10 which extend horizontally and along a geometrical plane at right angles to the plane P.

The walls 4, 6, 8 and 10 together delimit a housing L inside the enclosure 2.

The enclosure 2 also comprises a door 12, that can be moved selectively between closed and open positions. For example, the door 12 is mounted to pivot relative to one of the side walls 6 or 8 by means of a hinge. In the closed position, the door 12 encloses the housing L. In the open position, the housing L is open to the outside of the enclosure 2. To simplify, the door 12 is represented only in FIGS. 8 to 10.

The enclosure 2 further comprises an electrical device 20, fixed inside the housing L on the door 4. The device 20 is, here, a circuit breaker. The device 20 is for example electrically connected to electrical conductors which enter into the enclosure 2 by means of an opening formed on one or more walls of the enclosure 2, for example on the wall 4. To simplify, these electrical conductors are not illustrated in the figures.

Figure 4:
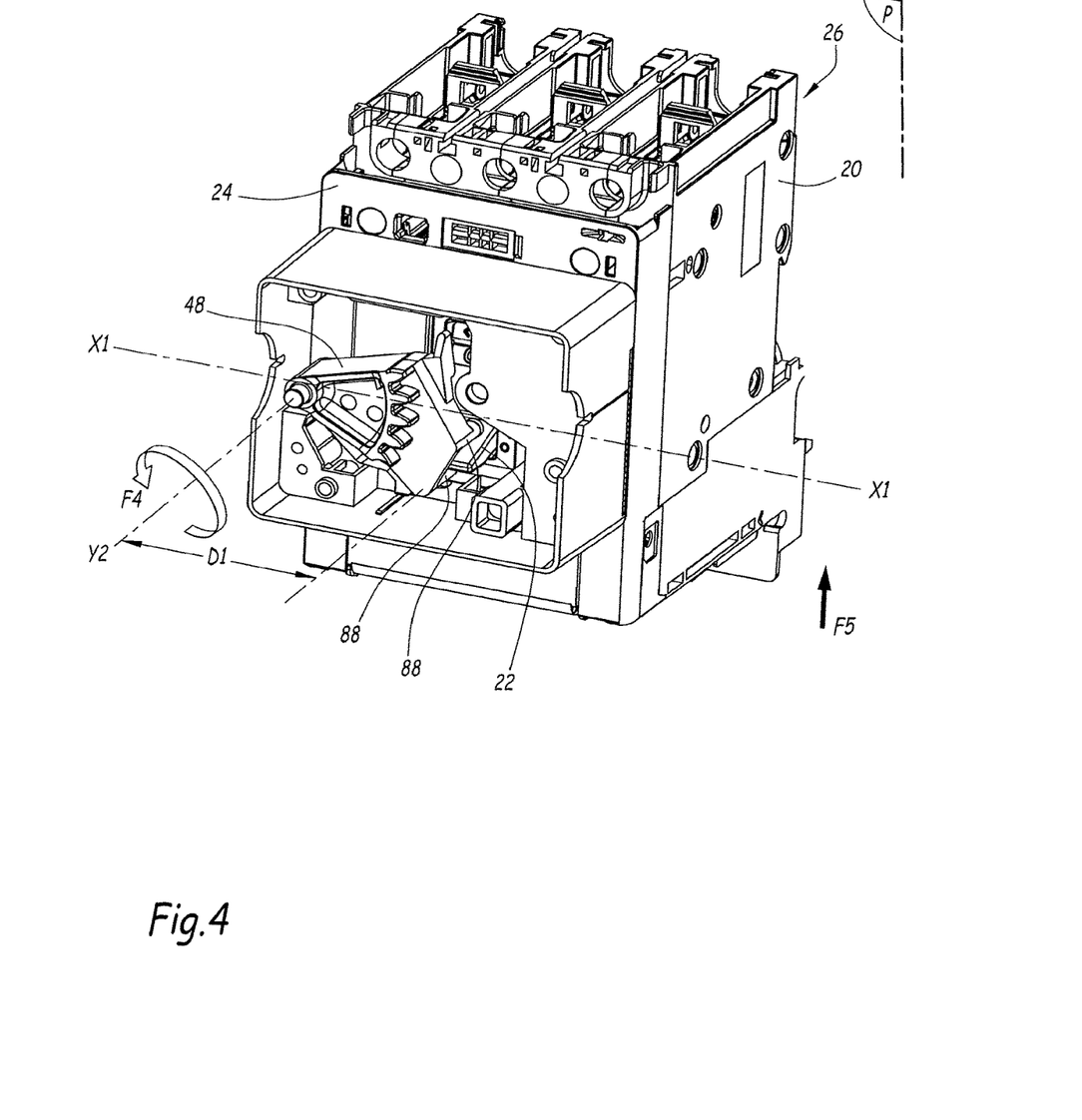
FIG. 4 is a perspective view of a mechanical coupling between a pinion of the control device of FIG. 3 and a control lever of the electrical device of FIGS. 1 and 2.

As illustrated in FIG. 4, the device 20 comprises a control lever 22, or rocker switch, that can be moved selectively and reversibly between the first and second stable positions each corresponding to an electrical state of the device 20. For example, the first position corresponds to a so-called "off" state of the device 20 and the second position corresponds to a so-called "on" state of the device 20.

The lever 22 is, here, arranged on a front face 24 of the device 20. The front face 24 is arranged opposite a rear face 26 which itself fixes the device 20 to the wall 4. The lever 22 is mounted to pivot from top to bottom between its first and second positions about an axis rotation X1 that is fixed relative to the device 20. Here, the axis X1 extends horizontally and parallel to the plane P. The lever 22 is moved by exerting a translational force in a direction parallel to the plane P. This direction is, here, vertical.

The enclosure 2 further comprises a remote control device 30 for the device 20, to control the device 20 between its electrical states from the outside of the enclosure 2, including when the door 12 of the enclosure 2 is in the closed position.

X2 denotes a fixed axis of the control device 30. The axis X2 extends essentially at right angles to at least one or other of the side walls 6 and 8, even to both side walls 6 and 8. The axis X2 is described in more detail hereinbelow.

In an illustrative and nonlimiting example, the device 30 comprises, for this purpose, two rotary control members 32 and 32' that are fixed, respectively, onto the side walls 6 and 8. The rotary members 32 and 32' are, here, identical. Consequently, only the rotary member 32 is described in detail hereinbelow. Everything that is described with reference to the rotary member 32 applies to the rotary member 32'.

According to a preferred variant, only one or other of the rotary members 32 and 32' is present in the system 30.

The rotary member 32 can be moved selectively and reversibly between first and second stable configurations, by rotation about a fixed axis of rotation X3. In this example, the axis X3 is at right angles to the wall 6.

The rotary member 32 comprises a rotary control handle 34 which includes a grippable rotary part and a fixed part 36 secured to the wall 6. The handle 34 is for example the handle described in the patent EP 1 791 149 B1.

In this description, unless otherwise specified, when reference is made to the rotation of the handle 34, it must be understood that it is the mobile part of this handle which is moved in rotation, the fixed support 36 remaining immobile relative to the wall 6 on which the handle 34 is mounted. The same applies for the handle 34'.

The rotary member 32 further comprises a shaft 38 which extends essentially along an axis X3. The shaft 38 is secured in rotation with the handle 34 about the axis X3. For example, a distal end of the shaft 38 is fixed mechanically to a coupling 39 extending securely with and in the extension of the mobile part of the handle 34. The shaft 38 here has a length, measured along the axis X3, preferentially of between 40 mm and 500 mm. In this example, when the device 32 is in an installed state, the axis X3 coincides with the axis X2. Thus, the assembly formed by the handle 34 and the shaft 38 is secured in rotation about the axis X2. Hereinbelow, first and second configurations of the handle 34 correspond respectively to the first and second configurations of the rotary member 32'.

The rotary member 32' comprises a handle 34', a fixed support 36', a shaft 38' and a coupling 39' which serve the same purpose, respectively, as the handle 34, the fixed support 36, the shaft 38 and the coupling 39.

The control device 30 further comprises a transmission system 40 which mechanically links the rotary member 32 to the control lever 22, such that the rotation of the rotary member 32 between its first and second configurations drives the lever 22 to move between its first and second positions.

Figure 2:
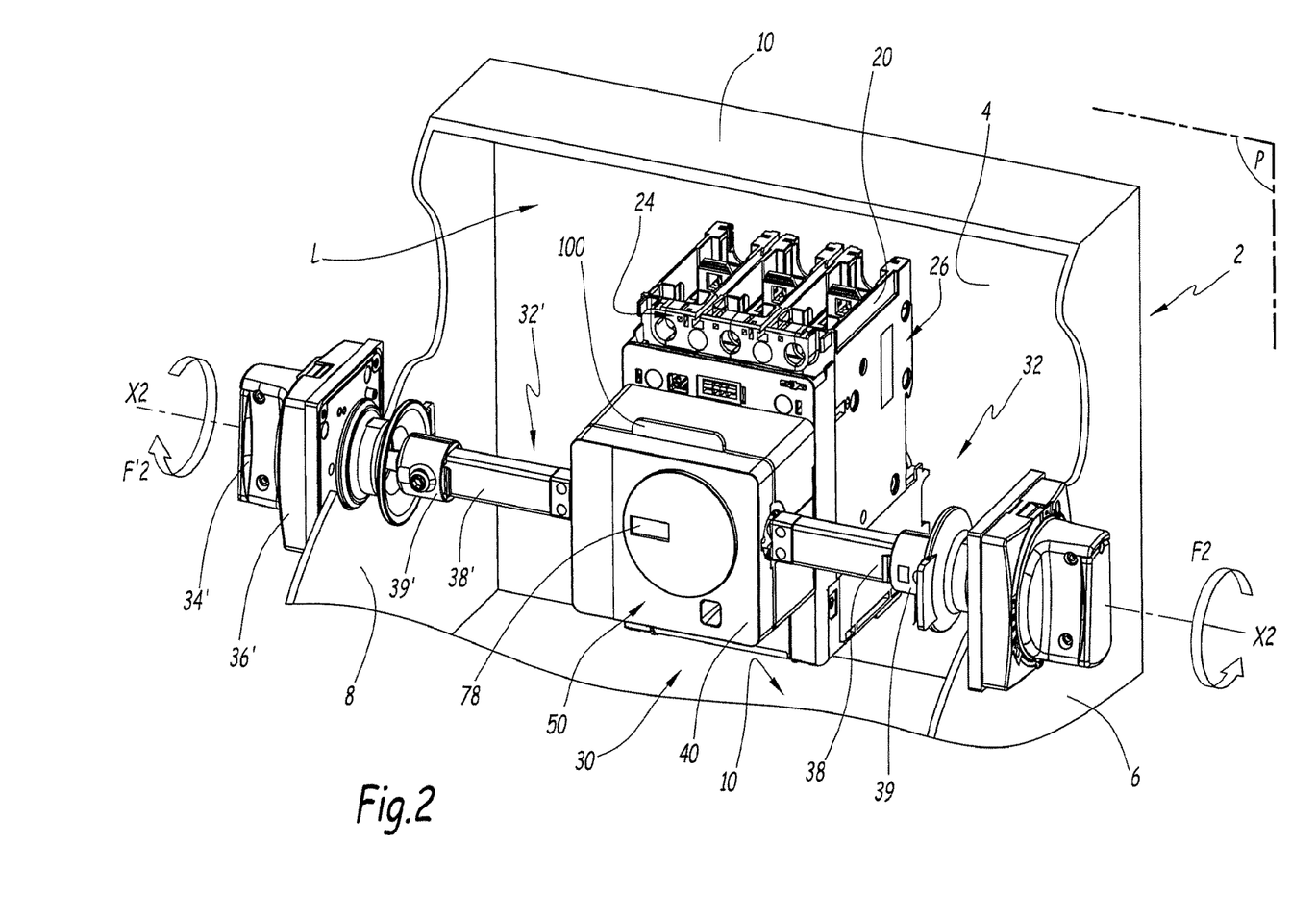

In this example, the first configuration of the handle 32 corresponds to the first position of the lever 22, which itself corresponds to the off state of the device 20. In its first configuration, the mobile part of the handle 34 extends in a horizontal direction, as illustrated in FIG. 1. The second configuration of the rotary member 32 corresponds to the second position of the lever 22, which itself corresponds to the on state of the device 20. In the second configuration, the mobile part of the handle 34 extends in a vertical direction, as illustrated in FIG. 2.

The movement of the handle 34 from its first configuration to its second configuration is, here, performed by turning the handle 34 about the axis X2 with an angle of 90° in a clockwise direction of rotation, represented by the arrow F1 in FIG. 1. The handle 34 is switched over from its second configuration to its first configuration by turning this handle by an angle of 90° about the axis X2 in the opposite direction, that is to say in the anticlockwise direction, represented by the arrow F2. Such configurations are, in practice, preferable for ergonomic reasons. Similarly, the member 32' is moved in its clockwise direction, illustrated by the arrow F'1 in FIG. 1, to move the lever 22 to its second position, and, alternatively, is moved in its anticlockwise direction, illustrated by the arrow F'2 in FIG. 2, to move the lever 22 to its first position.

For each handle 34, 34', the clockwise direction of rotation is defined relative to an observer observing this handle and standing facing the side wall, respectively, 6 and 8, outside the cabinet 2.

More specifically, the transmission system 40 converts the rotation of the rotary member 32 into an essentially rectilinear movement of the control lever 22 in a plane of movement parallel to the geometrical plane P. The device 40 is advantageously configured for the rotation by an angle of 90° of the control member 32 or 32' to drive a movement of the lever 22 all along its travel, to switch it over to its second position.

Figure 3:
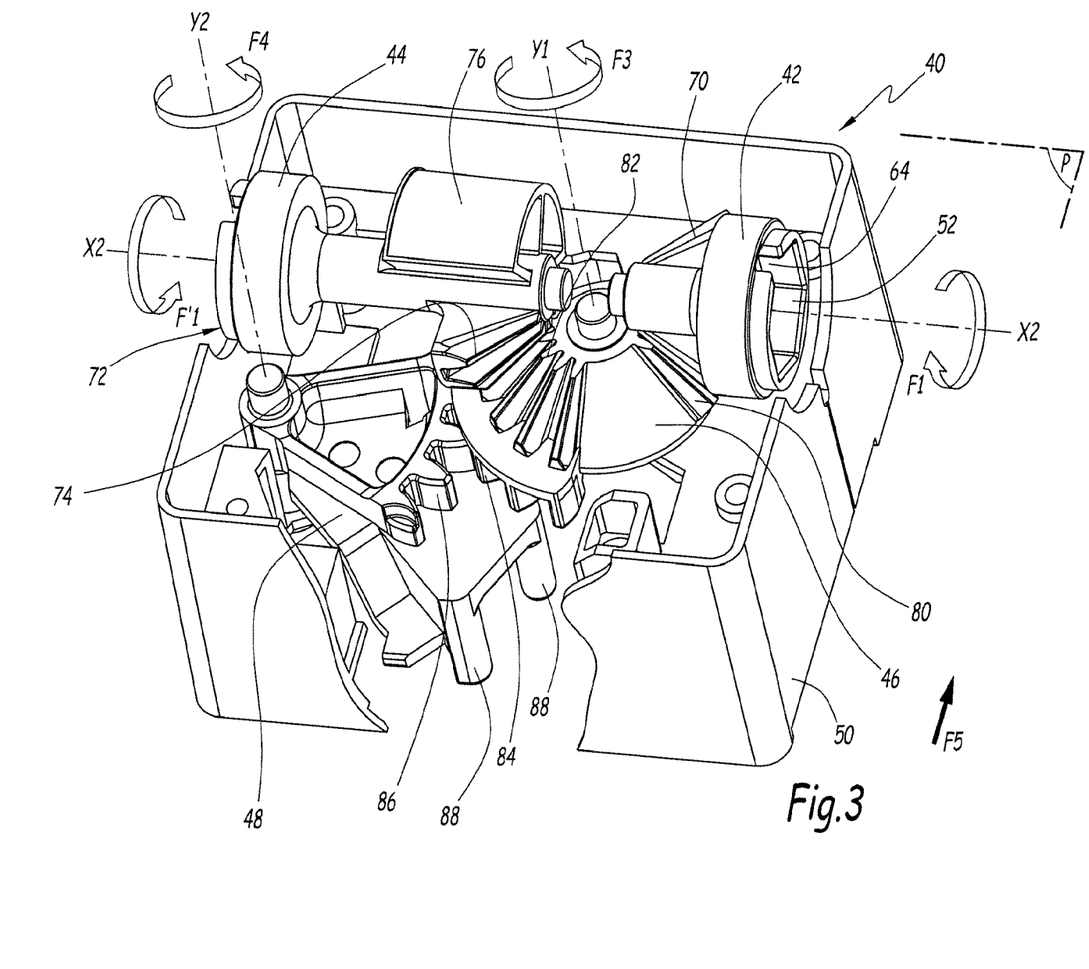
FIG. 3 is a schematic representation of a transmission system of the control device according to the invention.

The transmission system 40 comprises pinions 42, 44, 46 and 48, the purpose of which is described in more detail hereinbelow. The pinions 42, 44, 46 and 48 are arranged inside a casing 50 of the system 40. The casing 50 here has a trapezoid form with parallelepipedal base. The casing 50 is fixed onto the front face 24 of the device 20. For example, the casing 50 is made of plastic material. The casing 50 comprises two side orifices each formed on a side wall of this casing 50 facing, respectively, the walls 6 and 8 of the enclosure 2. For example, the casing 50 has an opening on its rear face, that is to say that turned towards the front face 24 of the device 20, to ensure a mechanical coupling with the lever 22. Thus, the system 30 is easy to install on the front face 24 of an existing device 20.

The pinion 42 is mounted to rotate freely about the axis X2 relative to the casing 50. This pinion 42 is, here, suitable for being secured in rotation with the rotary member 32 about the axis X2. For example, the pinion 42 comprises a housing 52 for receiving, removably, the shaft 38.

Figures 5, 6:
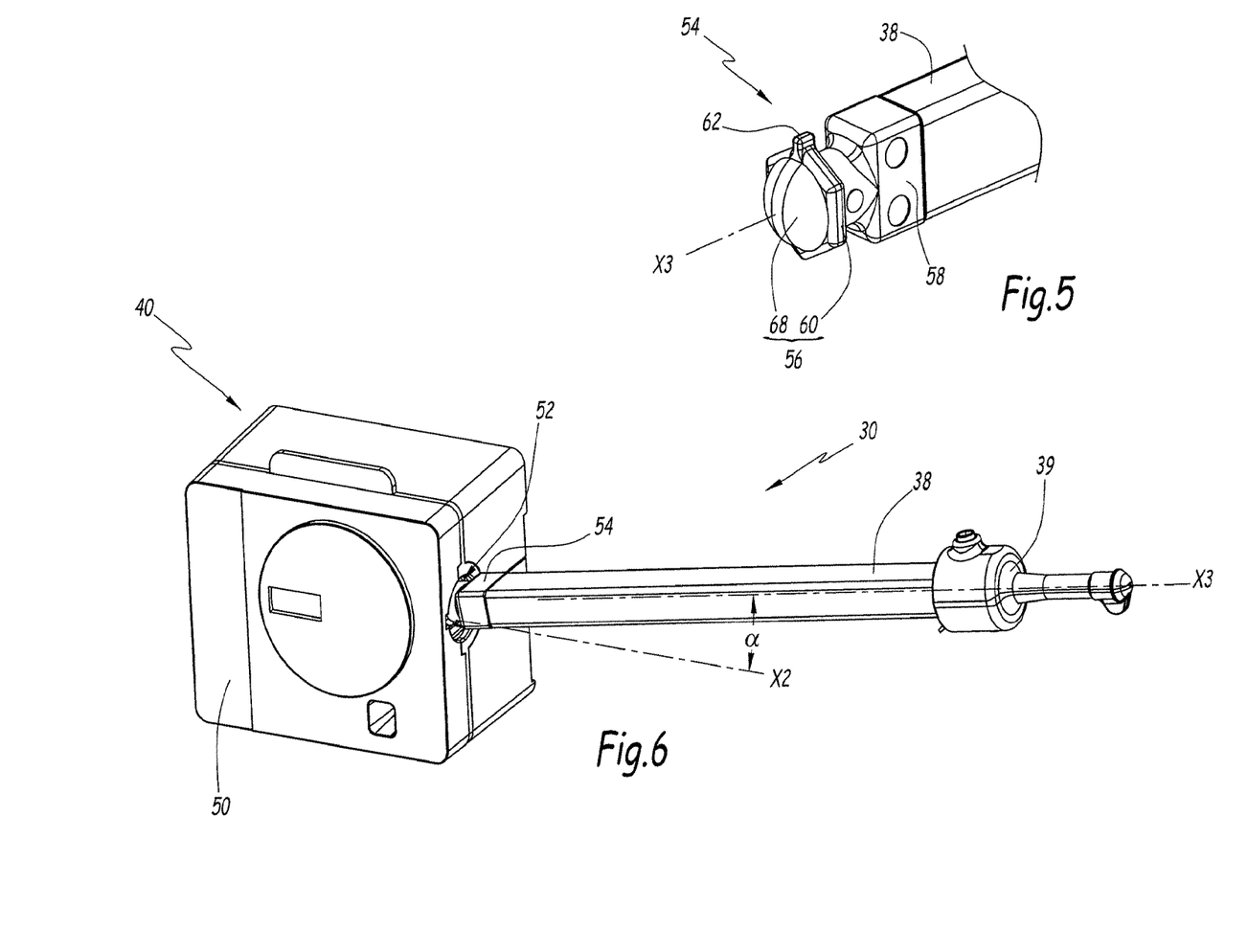
FIG. 5 is a schematic representation of a connecting end-fitting between the rotary handle of the control device of FIG. 1 and one of the pinions of the transmission system of FIG. 3.
FIG. 6 is a perspective view of the transmission system of the device of FIGS. 1 and 2 in which a connecting shaft of the handle is inserted into the first pinion with an angular offset.

In this case, the rotary member 32 comprises a connecting end-fitting 54 which is mounted on a distal end of the shaft 38, as illustrated in FIG. 5, opposite the proximal end of the shaft received in the coupling 39. The end-fitting 54 comprises a head 56 and a body 58 force-fitted into a hollow body delimited at the end of the shaft 38. The head 56 is coupled securely and with no degree of freedom to the body 58. For example, the end-fitting 54 is a mechanical part produced in a single piece, here made of an aluminium alloy or of plastic material, for example by moulding.

In a variant, the arm 38 is omitted. In this case, the end-fitting 54 is received directly in the coupling 39 to secure the mobile part of the handle 34 in rotation with the pinion 42.

The head 56 and the housing 52 have forms complementing one another, so that the head 56 is received inside the housing 52 to transmit the rotational movement about the axis X2. For example, the head 56 comprises a peripheral portion 60, which extends here along a plane at right angles to the shaft 38 and which has a section of hexagonal form. The housing 52 comprises a complementary form, that is to say, here, hexagonal and hollow, making it possible to mount the head 56 without play. In a variant, other forms are possible, such as a square form or a form of any other polyhedron.

Advantageously, the end-fitting 54 comprises a positioning snug 62 protruding from this head 54. The snug 62 here protrudes in a direction at right angles to the axis X3. Preferably, the snug 62 is placed on the peripheral portion 60. The pinion 42 also comprises a cavity 64 of a form complementing the snug 62, to receive this snug 62 when the end-fitting 54 is received in the housing 52. The snug 62 and the cavity 64 simplify the insertion and the positioning of the rotary control member 32 in the pinion 42. In effect, that makes it possible to make the first and second configurations of the rotary control member 32 correspond to the first and second positions of the lever 22. Because of the snug 62 and the cavity 64, the rotary member 32 can be inserted into the pinion 42 only if it is positioned such that the snug 62 is facing the cavity 64. The same applies for the pinion 44.

Advantageously, the head 56 of the end-fitting 54 comprises a ball joint 68. The ball joint 68 is, here, placed on the distal end of the end-fitting 54, in the extension of the portion 60. The pinion 42 comprises a housing of complementary form to receive this ball joint 68. For example, such a housing is situated inside the pinion 42 in the extension of the housing 52.

The ball joint 68 forms, with the pinion 42, a ball joint link which allows an angular offset between the axis X2 of rotation of the pinion 42 and the axis X3 of the rotary member 32 when the latter is in an installed state in the device 30. The angle between the axes X2 and X3 is denoted α. The angle α has an absolute value less than or equal to 10°, preferably 5°, even more preferably 2°. Preferably, the angle α is zero.

The ball joint link allows a misalignment of the rotary member 32 which would result from a mounting error of the system 30, as illustrated in FIG. 6. In effect, to mount the system 30 in the enclosure 2, a user has to drill a hole in the side wall 6 to place the handle 34 of the rotary member 32 therein. This drilling must be done such that the centre of the hole is located facing the housing 52 of the pinion 42 and aligned on the axis X2. It is common place for such a hole to be drilled with a slight position error, for example such that the centre of the hole is located at a distance less than 1 cm or 5 mm from the axis X2. The result thereof is a misalignment of the axis X3 relative to the axis X2. By virtue of the ball joint 68 and the pinion 42 the rotation of the rotary control member 32 about the axis X3 nevertheless makes it possible to rotationally drive the pinion 42 about the axis X2 and therefore the control movement of the control lever 22 between its first and second positions. Despite this misalignment, the peripheral portion 60 is at least partially received in the housing 52.

In this description, because of the small values allowed for the angle alpha, it is considered that the rotation of the member 32 between its first and second configurations is performed essentially about the axis X2, even when the angle α is not zero.

Hereinbelow, to simplify the description, the rotary member 32 does not exhibit such an offset. The angle α is equal to 0° and the axis X3 coincides with the axis X2.

In this example, as illustrated in FIG. 3, the pinion 42 has an essentially tapered form of axis X2 and the base of which comprises the cavity 52. The pinion 42 comprises a series of teeth 70 formed on its outer circumference. The pinion 42 meshes with the pinion 46.

The pinion 44 is rotationally mobile about the axis X2 and is configured to receive the rotary member 32'. The pinion 44 serves, with respect to the member 32', the same purpose as the pinion 42 with respect to the member 32. Thus, everything described with reference to the pinion 42 applies to the pinion 44. In particular, the pinion 44 comprises a housing 72 configured to receive the end-fitting 54. The pinion 44 comprises teeth 74 which mesh with the pinion 46.

Advantageously, the pinion 44 comprises a peripheral portion 76 secured in rotation with the pinion 44 about the axis X2 and a face of which is turned towards the outside of this pinion 44. The casing 50 then further comprises a window 78 which, when the system 40 is in a mounted state, emerges on this portion 76 so as to make it visible from outside the casing 50. Visual indicators, for example "ON" and "OFF" marks, are placed on the portion 76 at predefined and distinct points of this portion 76 to indicate the current position of the control lever 22.

The pinion 46 meshes with the pinions 42 and 44. The pinions 42 and 44 are placed on one and the same side of the pinion 46. The pinion 46 is rotationally mobile about a fixed axis Y1 which is at right angles to the axis X2 and to the geometrical plane P. The pinion 46 is suitable for being mechanically coupled with the lever 22 when the device 30 is mounted on the device 20. Here, the pinion 46 is indirectly coupled with the lever 22 by means of the pinion 48. For example, the pinion 46 extends essentially parallel relative to the plane P. The pinion 46 here comprises two series of teeth 80 and 82 which are meshed respectively with teeth 70 and 74. On a face opposite the pinions 42 and 44, the pinion 46 comprises a series of teeth 84 which is meshed with the teeth 86 of the pinion 48.

The pinion 48 is rotationally mobile about a fixed axis Y2 parallel to the axis Y1. Here, these two axes Y1 and Y2 are at a distance from one another. The axis Y2 is separated from the lever 22 by a distance D1, measured in a geometrical plane parallel to the plane P. The distance D1 is for example greater than or equal to 2 cm or 5 cm. Thus, the pinion 48 acts as a lever arm, enabling it to exert a force on the control lever 22 that is great enough to move it between the first and second positions. The pinion 48 here comprises claws 88 which are arranged on either side of the control lever 22 when the device 30 is mounted on the device 20.

In FIGS. 3 and 4, the various constituent elements of the system 40 are illustrated in their position corresponding to the first position of the lever 22. To switch the lever 22 to its second position, one or other of the rotary control members 32 and 32' is turned from its first configuration to its second configuration by imparting on it a rotational movement about the axis X2 in the clockwise direction relative to this rotary member 32 or 32'.

For example, the handle 34 is turned to its second configuration in the clockwise direction illustrated by the arrow F1. Alternatively, the handle 34' is turned to its second configuration in its clockwise direction represented by the arrow F'1. This rotational movement of one or other of the pinions 42 and 44 drives the rotation of the pinion 46 about the axis Y1 as illustrated by the arrow F3 in FIG. 3. Thus, because of the configuration of the system 40, the pinion 46 turns in the same direction of rotation about the axis Y1 when each of the pinions 42 or 44 is rotated about the axis X2 in its clockwise direction. This rotational movement of the pinion 46 drives the pinion 48 in rotation about the axis Y2 as illustrated by the arrow F4. The claws 88 exert, on the control lever 22, a translational force oriented in a direction parallel to the plane P, as illustrated by the arrow F5 in FIGS. 3 and 4. At the end of the rotation, the lever 22 is in its second position. The electrical device is in its electrical on state.

To move the control lever 22 back to its first position, one or other of the rotary members 32 and 32' is rotated to its first configuration, in the opposite direction, that is to say in the direction of the arrows F2 or F'2, respectively. That makes the pinions 46 and 48 turn, in a direction opposite to the arrows, respectively F3 and F4 and moves the control lever 22.

Thus, by virtue of the device 40, one and the same rotary member 32 or 32' can be used with one or other of the pinions 42 or 44 to control the movement of the lever 22.

The rotary member 32, 32' can thus be placed without preference on one or other of the side walls 6 or 8 of the enclosure 2. There is therefore no need to provide distinct rotary members which would be specifically adapted to be placed only on the right 6 or left 8 side face. The manufacture of the device 30 is thus simplified. The installation of the device 30 is also facilitated, because a user does not need to obtain a specific rotary control member when he or she wants to position the handle 34, 34' on the right 6 or left 8 side face of the enclosure 2.

Furthermore, the pinion 46 couples the rotation of the pinions 42 and 44 about the axis X2. This is advantageous in the illustrative but non-obligatory case where the device 30 comprises both the rotary members 32 and 32'. Thus, when the rotary member 32 is moved between its configurations by a user, the member 32', which has not been actuated by the user, is mechanically moved to its corresponding configuration. A situation in which the control handles 34 and 34' situated on the opposing side walls 6, 8 of the enclosure 22 exhibit different configurations, which would be prejudicial for a user who would not then know the exact current state of the device 20, is thus avoided.

Figure 7:
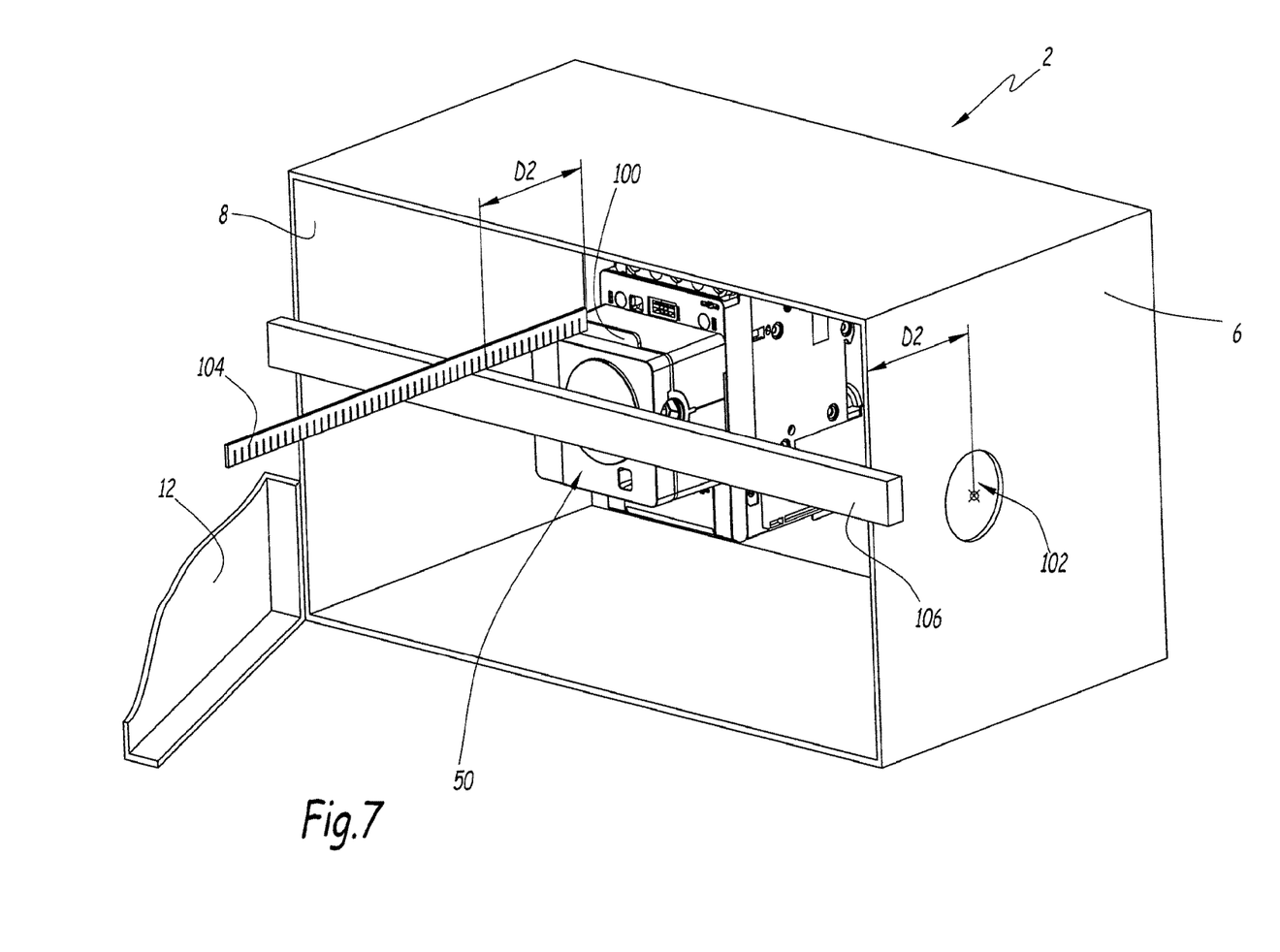
FIG. 7 is an external perspective view of a marker for aligning the control device relative to the electrical enclosure for the installation of the control device.

Advantageously, the device 40 comprises a positioning tongue 100, mounted outside the casing 50 and protruding relative to the casing 50, preferably on an upper part of this casing 50, as illustrated in FIG. 7. The tongue 100 extends in a geometrical plane parallel to the plane P and containing the axis of rotation X2. For example, the tongue 100 is a mechanical part inserted between distinct front and rear parts of the casing 50. The tongue 100 is preferably made of a rigid material, for example a plastic material.

The tongue 100 makes it possible for a user, during the installation of the device 30 on the device 20, to determine where a hole 102 must be drilled in the side wall 6 or 8 to allow the passage of the rotary member 32. When the door 12 is open, the tongue 100 makes it possible to receive, in abutment, a graduated rule 104 extending at right angles to the plane P and resting on a support bar 106 arranged horizontally parallel to the plane P bearing against the ends of the side walls 6 and 8. The distance D2 which separates the axis of rotation X2 from the outer edge of the walls 6 and 8 can thus be measured easily using the rule 104. The user can thus, by plotting this distance D2 on the wall 6, easily centre the hole 102 on the axis X2, which reduces the risk of the rotary member 32 or 32' being installed in a misaligned position relative to the axis of rotation X2.

Figure 8:
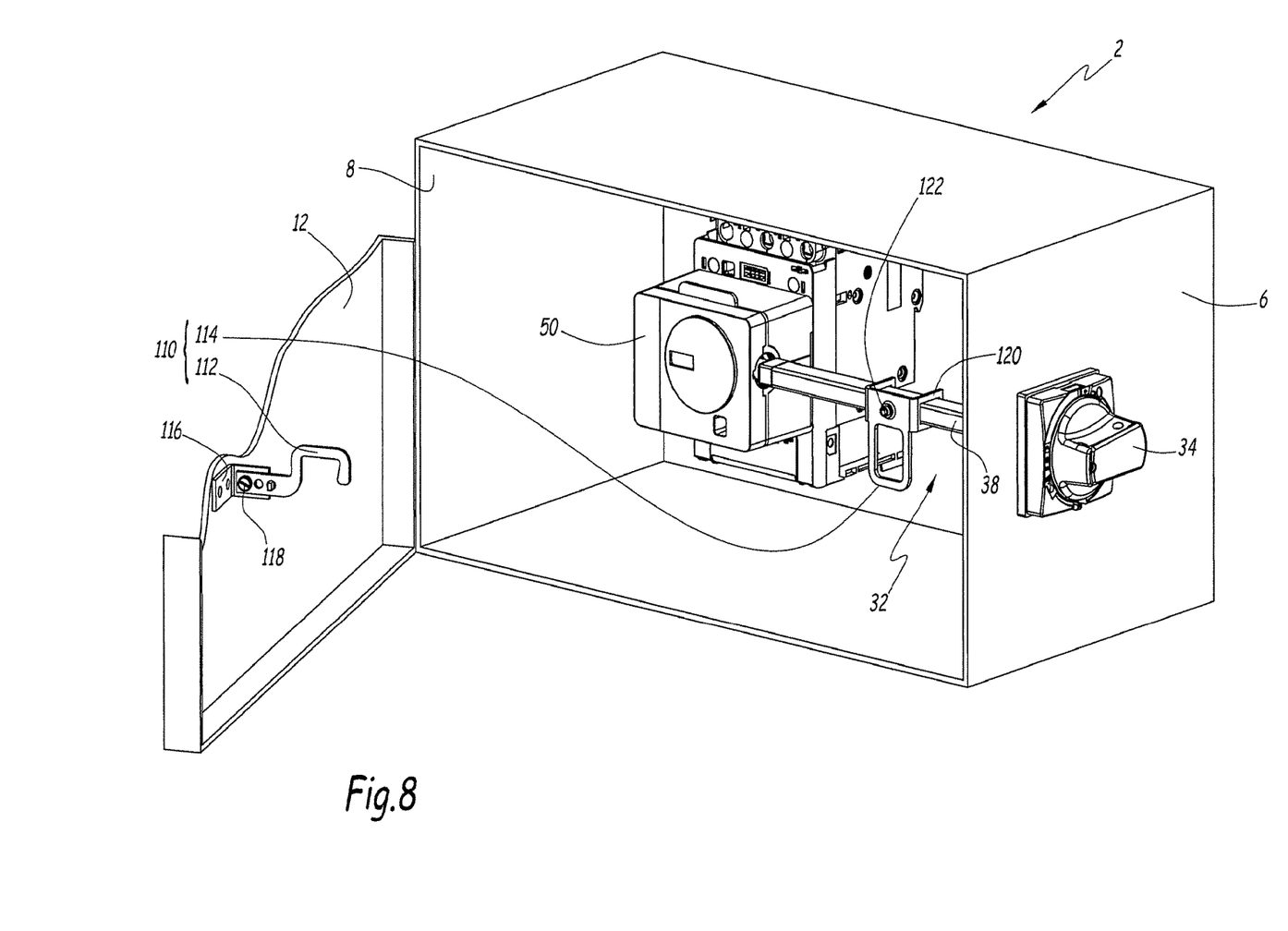
FIGS. 8 to 10 are perspective views of a system for locking the door of the enclosure coupled with the remote control device according to the invention.
Figure 9:
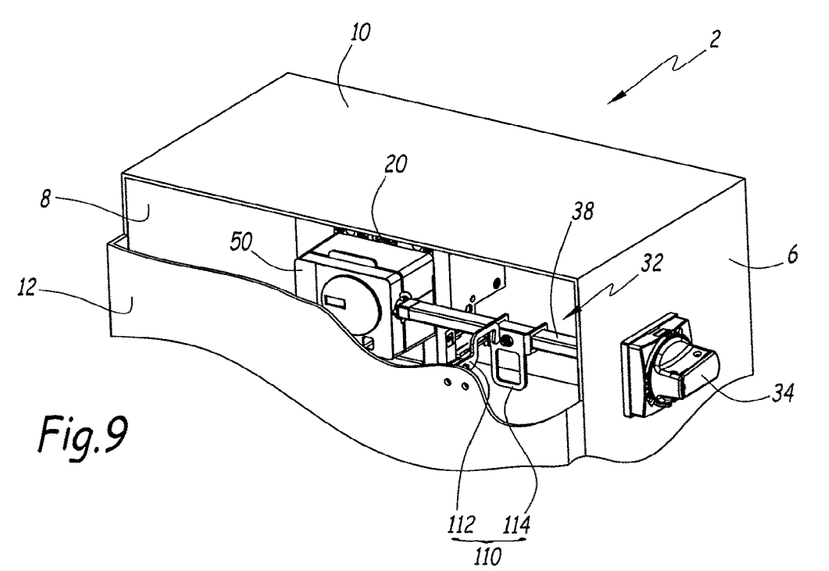
Figure 10:
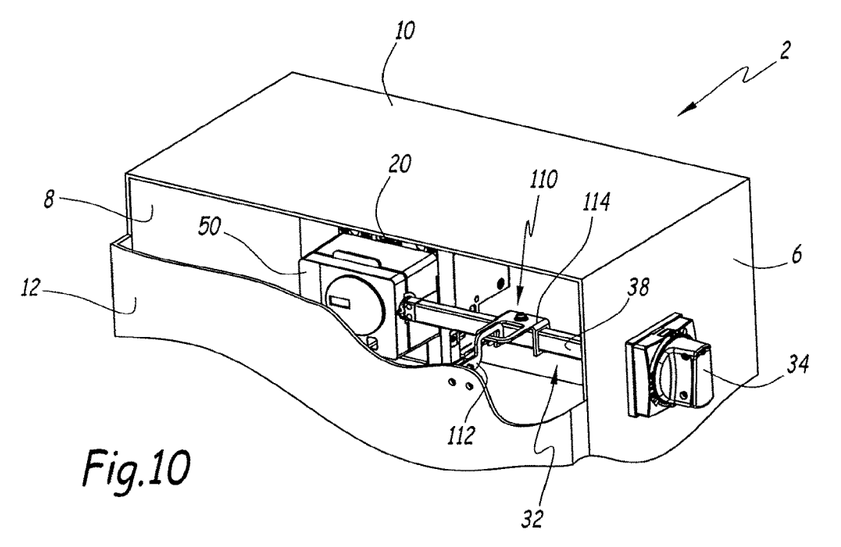

Advantageously, as illustrated in FIGS. 8 to 10, the device 30 further comprises a system 110 for locking the door 12 in its closed position. In FIGS. 8 to 10, the rotary member 32' is, here, omitted.

In this example, the system 110 comprises a hook 112 and a ring 114. The hook 112 and the ring 114 are of complementary forms. The hook 112 is suitable for being inserted into the ring 114.

In this example, the hook 112 is fixedly mounted on an inner face of the door 12, for example, by means of a fixing support 116 secured to the door 12 and provided with a plurality of screw holes. The hook 112 comprises, on an attachment portion, one or more corresponding holes making it possible, when they are facing a respective hole of the support passage 116, to insert a fixing part 118, such as a screw and a bolt.

The ring 114 is secured in rotation with the rotary member 32. The ring 114 comprises an attachment support 120 held secured in rotation with the shaft 38 about the axis X2, for example by means of a screw 122. Obviously, the ring 114 could equally be placed on the rotary member 32'.

When the door 12 is closed, as illustrated in FIGS. 9 and 10, the locking device 110 can be moved between locking and unlocking positions of the door 12, associated respectively with the second and first configurations of the member 32, and therefore with the second and first electrical states of the electrical device 20.

In the unlocking position, as illustrated in FIG. 9, the hook 112 is situated outside the ring 114, at a distance from the ring 114. The hook 112 and the ring 114 can be translationally relative to one another without hindrance. Thus, the locking system 110 does not prevent the opening of the door 12.

In the locking position, illustrated in FIG. 10, the hook 112 is received inside the ring 114 and prevents any translational movement of the ring 114 relative to the hook 112. Thus, the door 12 cannot be opened.

Thus, the door 12 is locked as long as the electrical device 20 is in its on state. The system 110 unlocks the door 12 only when the rotary member 32 is manoeuvred to its first position, and therefore the electrical device 20 is in its off state. Such operation of the door 12 is notably dictated by international standards relating to the safety of electrical equipment.

In a variant, the hook 112 is secured to the rotary member 32 and the ring 114 is mounted on the door 12.

The locking system 110 can be used independently of the transmission system 40.

The variants and embodiments described above can be combined with one another to form novel embodiments of the invention.

The invention claimed is:

1. A remote control device for an electrical device in an electrical enclosure, said electrical enclosure including a bottom wall and side walls extending at right angles to the bottom wall and delimiting a housing, an electrical device being fixed, on the bottom wall, inside the housing, said remote control device comprising:
   a rotary control member that is fixed onto a wall of the enclosure outside the housing at a right angle to a face of the electrical device, the rotary control member remaining at a same orientation relative to the face of the electrical device when the electrical enclosure is open and when the electrical enclosure is closed, said rotary control member being selectively movable between first and second configurations,
   a transmission system that mechanically links the rotary control member to a control lever of the electrical device, said control lever movable between the first and second positions, the transmission system moving the control lever between the first and second positions based on movement of the rotary control member between the first and second configurations,
   wherein:
   the rotary control member is mountable on one of the side walls of the housing and is rotationally mobile,
   the transmission system comprises:
   a first pinion, secured in rotation with the rotary control member about a first fixed axis, at right angles to the side walls,
   a second pinion, meshed with the first pinion and rotationally mobile about a second fixed axis at right angles to the first fixed axis, said second pinion being coupled mechanically with the control lever to move said control lever between the first and second positions when the second pinion is moved in rotation.

2. The remote control device according to claim 1, wherein the rotary control member comprises a rotary handle mounted on the side wall and a shaft extending along a third axis and which secures, in rotation about the first axis, a mobile portion of the rotary handle with the first pinion.

3. The remote control device according to claim 2, wherein the rotary control member comprises a connecting end fitting with the first pinion, said connecting end fitting being secured, with no degree of freedom, with an end of the shaft and having a head received in a housing of complementary form formed on the first pinion to secure the shaft in rotation with the first pinion.

4. The remote control device according to claim 3, wherein the head of the connecting end fitting comprises a snug protruding from said head in a direction at right angles to the third axis and in that the first pinion comprises a cavity of complementary form to receive said snug when the end fitting is received in the housing.

5. The remote control device according to claim 3, wherein the head of the connecting end fitting comprises a ball joint, and the first pinion comprises another housing of complementary form to receive said ball joint.

6. The remote control device according to claim 5, wherein the third axis exhibits an angular offset of angle α relative to the first axis, the angle α having a value less than or equal to 10°.

7. The remote control device according to claim 1, wherein:
the control lever is moveable between the first and second positions by movement in a direction parallel to a plane containing the bottom wall of the housing;
the transmission system comprises a third pinion meshed with the second pinion and rotationally mobile about a fourth fixed axis parallel to the second fixed axis, said third pinion comprising claws configured to be arranged on either side of the control lever.

8. The remote control device according to claim 1, wherein the transmission system comprises a casing inside which are arranged the first and second pinions, said casing being configured to be fixed onto the electrical device to control the movement of the control lever thereof.

9. The remote control device according to claim 8, wherein the casing includes a window configured to permit viewing of an indicator of a state of the electrical device.

10. The remote control device according to claim 9, wherein the state of the electrical device includes an on state and an off state.

11. The remote control device according to claim 9, wherein the casing is configured to attach to the face of the electrical device.

12. An electrical enclosure, comprising:
a bottom wall and side walls extending at right angles relative to the bottom wall, these walls delimiting a housing,
an electrical device, fixed inside the housing on the bottom wall and comprising a control lever that can be moved between first and second positions, and
a remote control device according to claim 1 for the electrical device.

13. The electrical enclosure according to claim 12, comprising:
a door configured that is selectively movable between positions of opening and of closing of the housing, and
a locking system that locks the door in a closed position, said locking system comprising a hook and a ring, one or other of the hook and of the ring being fixed onto an inner wall of the door, the other of the hook and of the ring being mounted on the transmission system and being secured in rotation about the third axis with the rotary control member, between:
a locking position, in which, when the door is in the closed position, the hook penetrates into the ring and prevents the movement of the door to its open position, and
an unlocking position, in which, when the door is in the closed position, the hook and the ring are remote from one another and allow the movement of the door to its open position.

14. The electrical enclosure according to claim 13, wherein the device is mounted on and secured in rotation with the shaft.

* * * * *